United States Patent [19]

Moore

[11] 3,915,769

[45] Oct. 28, 1975

[54] PROTECTED CROSSOVER CIRCUITS AND METHOD OF PROTECTING THE CIRCUITS

[75] Inventor: Robert L. Moore, Emmaus, Pa.

[73] Assignee: Western Electric Co., Inc., New York, N.Y.

[22] Filed: July 2, 1973

[21] Appl. No.: 375,412

[52] U.S. Cl. ........................ 156/7; 29/578; 96/36.2; 317/101 A; 317/101 CE; 428/96

[51] Int. Cl.$^{2}$ ........................................ H01L 21/94

[58] Field of Search .................. 156/8, 13, 17, 6, 7; 29/578, 580, 591, 626; 117/102 R, 218, 232; 96/35.1, 36.2; 317/101 A, 101 B, 101 CE; 357/68; 174/68.5

[56] References Cited

UNITED STATES PATENTS

| | | | |
|---|---|---|---|
| 3,461,524 | 8/1969 | Lepselter | 29/25.42 |
| 3,525,617 | 8/1970 | Bingham | 317/101 CE |
| 3,672,985 | 6/1972 | Nathanson et al. | 317/101 A |
| 3,693,251 | 9/1972 | Jaccodine | 317/101 CE |
| 3,758,943 | 9/1973 | Shibata | 29/578 |
| 3,762,040 | 10/1973 | Burns et al. | 317/101 CE |

*Primary Examiner*—Douglas J. Drummond
*Assistant Examiner*—Jerome Massie
*Attorney, Agent, or Firm*—W. O. Schellin

[57] ABSTRACT

In crossover circuits, air-insulated crossover conductors on a substrate for hybrid integrated networks are solidly supported to prevent electrical shorts between the crossover and any underlying conductors. In doing this, a resin is applied over the surface of the substrate. Capillary attraction forms an agglomeration of the resin about each crossover conductor. The resin is then hardened to form supports for the crossover conductors. Subsequent etching and rinsing removes all of the resin from the surface of the substrate but leaves it under the crossover conductors to continue supporting them. With the resin so removed, semiconductor chips may be bonded to terminal areas on the substrate.

5 Claims, 8 Drawing Figures

PROTECTED CROSSOVER CIRCUITS AND METHOD OF PROTECTING THE CIRCUITS

BACKGROUND OF THE INVENTION

1. Field of the Invention

This invention relates to crossover circuits and particularly to the protection of air-insulated crossover circuits.

Crossover circuits are used in integrated and other micro-electronic circuits. As the complexity of these circuits increases, the need for crossover circuits also increases. A crossover circuit usually involves two or more conductors, one or more of which usually lies in the plane of a top surface of a substrate and is bridged by a crossover conductor with a space or gap between the crossover conductor and the underlying conductor to avoid electrical connection between the crossing conductors.

2. Description of the Prior Art

Crossover circuits in accordance with the prior art can be classified as being either air-insulated or solid-dielectricinsulated. Methods of manufacturing crossover circuits of either type have been disclosed in U.S. Pat. No. 3,461,524 to M. P. Lepselter.

Of the two types of crossover circuits disclosed in the aforementioned patent, the air-insulated one is more readily manufactured because of a smaller number of process steps required to produce it. Each additional step, particularly if it involves precise masking, increases the chance for errors to occur and thus increases the chance of producing a defective circuit.

However, air-insulated crossover circuits are prone to becoming damaged during handling. For instance, conductive particles may lodge in the space between the crossing conductors, or the conductors may actually be forced into contact with each other. It is therefore, desirable to protect the crossover circuits from damage after they have been formed on circuit substrates. The process steps involved in protecting the crossover circuits preferably should be simple and efficient. Therefore, precise masking is not desirable because of cost considerations. However, areas on circuit substrates used for bonding integrated circuit chips to the substrates must be kept clean of contaminating material.

These bonding or contact areas are frequently found in proximity of crossover circuits. It is therefore desirable to utilize a method of protecting the crossover circuits that does not require precise masking, yet renders areas in proximity of the crossover circuits free of any materials that might interfere with bonding semiconductor chips to the substrates.

SUMMARY OF THE INVENTION

These and other objectives are met in accordance with this invention whereby a support is formed between a substrate and a member spaced from the substrate. In particular, a hardenable, wetting substance is applied to the surface of the substrate to form a layer of sufficient thickness to permit capillary attraction to draw the substance into and fill the space between the member and the substrate. The layer is then hardened to form the support between the member and the substrate. A portion of the surface of the hardened layer is then removed until the layer is eliminated everywhere from the substrate except for those portions of the layer that form the support between the substrate and the member.

BRIEF DESCRIPTION OF THE DRAWINGS

The invention, and its objects and features, will be more readily understood from the following detailed description when read in conjunction with the accompanying drawings in which.

DETAILED DESCRIPTION

While this invention is believed to have broader application, the invention will be described in detail in reference to forming supports between conductors of air-insulated crossovers as, for instance, those disclosed in the aforementioned U.S. Pat. No. 3,461,524 to M. P. Lepselter, assigned to the Bell Laboratories. This description is strictly illustrative; the invention being limited by the scope of the appended claims only.

Figure 1:
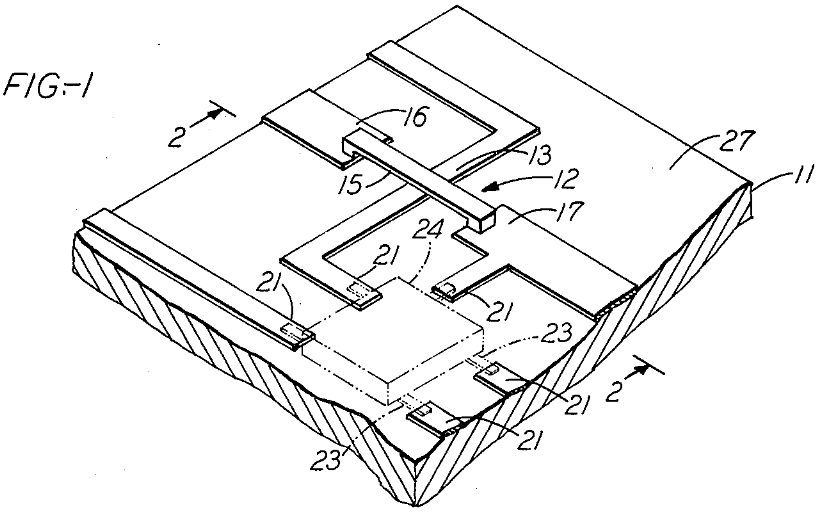
FIG. 1 is an isometric view of a portion of a substrate, illustrating a crossover circuit thereon.

Referring now to FIG. 1, a portion of a substrate 11 is shown. The substrate 11 may be used in the manufacture of hybrid integrated circuits frequently used in the microelectronic industry. Circuit elements shown on the portion of the substrate 11 in FIG. 1 include a crossover circuit, designated generally by the numeral 12.

The description of the substrate 11 and the circuit elements thereon relates particularly to alumina-ceramic substrates supporting metal circuit elements, such as gold. The composition of the substrate and the elements should be kept in mind in reading the following description, since a support-forming substance and an etchant must be selected so as to be neutral to the referred-to substrate 11 and the associated circuits.

The combination of conductors encompassed by terms "crossover circuit" broadly includes an underlying conductor 13 on the top surface of the substrate 11, and a crossover conductor 15 formed on conductors 16 and 17 on either side of the underlying conductor 13. The conductor 15 spans or bridges the conductor 13 with a gap or space 19 between the two conductors 13 and 15 (see FIG. 2). On occasion a crossover conductor 15 may bridge two or more parallel underlying conductors 13. Such an alternate crossover 12 does not affect this invention. Regardless of whether the conductor 15 bridges one or more conductors, the problem of protecting the crossover conductor 15 from accidentally being forced into contact with the underlying conductors remains the same.

The crossover circuit 12 is shown on a greatly enlarged scale to identify its component elements such as the conductors 13 and 15. In practice, one of the substrates 11, about 4 × 4 inches in size typically supports more than 100 crossover circuits, such as the crossover circuit 12 shown in FIG. 1. The actual number of crossover circuits 12 vary with the complexity of a particular circuit.

Crossover circuits 12 are used in arranging circuit terminations or contact areas 21 on the substrate 11 to correspond to respective leads 23 of a semiconductor device or chip 24 (shown in phantom lines in FIG. 1). As illustrated in FIG. 1, the crossover circuit 12 establishes electrical continuity between the conductor 16 and the lead 23 associated with the conductor 17.

The chip 24 is joined to the substrate 11 after the circuit patterns including the crossover circuit 12 have been generated thereon. The chip 24 is joined to the substrate 11, in the case of beam-lead chips (as shown in FIG. 1), by thermocompression bonding the beam leads 23 of the chip 24 to respective contact areas 21 on the substrate 11.

The bonding operation requires that the interface between each contact area 21 and each lead 23 is free of contaminants or foreign matter. Any foreign matter interposed between the surfaces of the two conductors 21 and 23 to be bonded would either seriously weaken such a bond or prevent a bond from being formed. Prior to bonding, the contact area 21 must consequently be free of all contaminants.

Because the chip 24 is bonded to contact areas 21 in proximity of the crossover circuit 12 on the substrate 11, an air-supported crossover circuit 12 may be damaged while the substrate 11 is handled in preparation for bonding the chip 24 to the substrate.

Accordingly, the crossover circuit 12 on a substrate 11 is preferably supported in accordance with the present invention after being generated and prior to the bonding of the chip 24 to the substrate 11.

Applying a Substance to the Substrate

Applying a layer of a substance in its liquid state to the surface of the substrate 11 may be preceded by a cleaning step. It is necessary, of course, that the substrate 11 be clean at the time of applying the substance in accordance with the invention. In accordance with prior art techniques, the substrate 11 may be cleaned by, for instance, subjecting it to a bath of acetone for approximately 5 minutes. This is followed by air-drying the substrate 11, thus permitting the acetone to evaporate. The cleaning step may be omitted where the substrate 11 is already clean of contaminants or foreign matter.

The substance selected to be applied to the substrate 11 must have insulator characteristics to maintain electrical separation between the conductors 13 and 15 after being applied therebetween. However, the substance need not be an insulator until after hardening has taken place.

Also, the substance must be easy to apply and must be capable of filling the space 19 between the conductors 13 and 15. The substance is, therefore, preferably applied in its liquid phase. If the substance is to be applied as a solid in powder form, it must be liquefiable to flow into the space 19 between the conductors 13 and 15. However, applying the substance as a liquid is preferred. In order to fill the space 19 between the conductors 13 and 15 the substance must be wetting with respect to the substrate 11 and particularly with respect to the crossover conductor 15.

After application of the substance in liquid form, or after liquefying the substance applied as a powder to the substrate 11, the substance having filled the space 19 must be capable of hardening to form the supports between the crossover conductor 15 and the substrate 11. In addition, the substance must lend itself to etching after the hardening, to permit a portion of a layer of the substance to be removed from its surface. An etchant, employed in removing the hardened substance must exhibit neutral characteristics toward substrate 11 or the circuit elements thereon.

A substance which observably meets these requirements and is feasible for forming a support under the crossover conductor 15 in accordance with this invention is a methyl phenyl polysiloxane resin marketed by Dow Corning under the tradename "Dow Corning 648." The resin is commercially available as a liquid. Its surface tension characteristics yield an acute contact angle between the resin and the solid boundary of the gold of the crossover. The liquid is therefore said to be wetting with respect to the material of the conductor 15.

Figure 6:
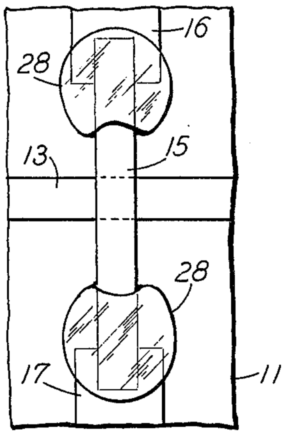
FIGS. 6, 7 and 8 show top views of a crossover conductor with various amounts of the substance accumulated in proximity of the conductor.
Figure 7:
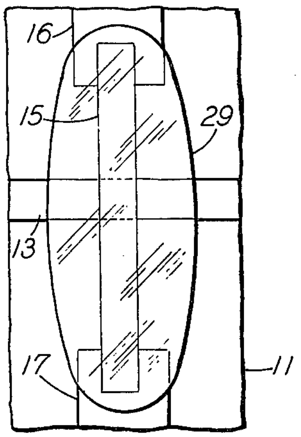
Figure 8:
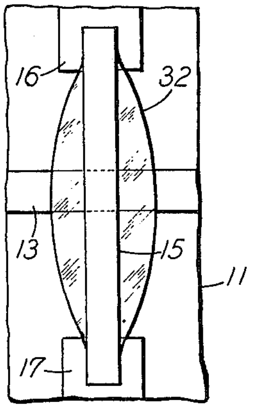

It has been observed that a minimum thickness of a coherent layer 26 of the substance or resin is required on the surface of the substrate 11 and the conductors 13, 16 and 17 before an agglomeration of the resin fills the space 19 between the conductor 15 and substrate 11. It is believed that capillary attraction starts agglomerations 28 of the resin at each end of the conductor 15 (see FIG. 6). As the thickness of the layer 26 increases the agglomerations 28 become larger in size and particularly increase toward each other until they meet and form one larger agglomeration 29, shown in FIG. 7.

It is this mechanism of forming two initial agglomerations 28 which later join that is believed to cause the substantial filling of the space 19 with the resin even though the dimensions on the substrate 11 are of a size which may be described as being "microscopic." For instance, a minimum desired dimension for the space 19 between the crossover conductor 15 and the underlying conductor 13 is about 0.001 inch. In practice, the dimension of the space 19 may be increased to approximately three-or four-thousandths of an inch, particularly where the substrate has been subjected to a treatment of raising the center portion of the unsupported length of the conductor 15 away from the substrate 11. Such a method of raising the centers of crossover conductors is disclosed in an application by W. H. Fowler, Ser. no. 264,127, filed June 19, 1972, and assigned to the assignee of this application.

In forming the agglomeration 29 of the resin about a crossover circuit 12 to fill the space 19 between the conductor 15 and the substrate 11, the thickness of the applied layer 26 of resin is about 0.001 inch. The precise minimum thickness of the layer 26 which causes the agglomeration 29 to form under each crossover circuit 12 of a given substrate varies, of course, with particular dimensions of the crossover conductors 15 on the substrate 11.

The resin may be applied to the substrate 11 in any of a number of ways. For instance, the resin has been applied to the substrate 11 by dipping the substrate 11 into the resin and then permitting the excess resin to drain off the substrate afterward.

Another method of applying the resin involves brushing the resin onto the substrate 11. Brushing, however, may damage the crossover circuit 12, and great care must be taken not to damage the circuit 12 while applying the resin by this method.

However, the latter method of applying the resin to the substrate 11 has an advantage of yielding a layer 26 on only one side of the substrate 11. This is preferred, particularly, since the substrate 11 for hybrid integrated circuits in the particular described examples has circuits on one side only. The absence of the resin on the other side of the substrate 11 minimizes problems related to handling the substrate 11 while the resin is still in its liquid form.

Figure 2:
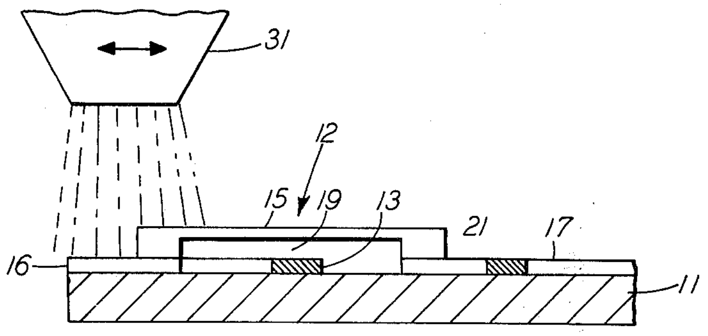
FIG. 2 is a cross-sectional view of FIG. 1, taken along line 2—2 of FIG. 1, showing a crossover conductor of the circuit of FIG. 1, to which a hardenable substance is about to be applied.

A preferred method of applying the resin to one side of the substrate 11 involves the use of a commercially available sprayer, such as a sprayer marketed by the Zicon Corporation under the name of "Zicon." The sprayer employs a traversing nozzle 31 shown in FIG. 2. The traversing movement of the nozzle 31 is complemented by the movement of a table (not shown) which is indexed laterally with respect to the nozzle 31. The traverse speed of the nozzle 31 may be varied just as the distance between the nozzle 31 and the table which supports the substrate 11.

Figure 3:
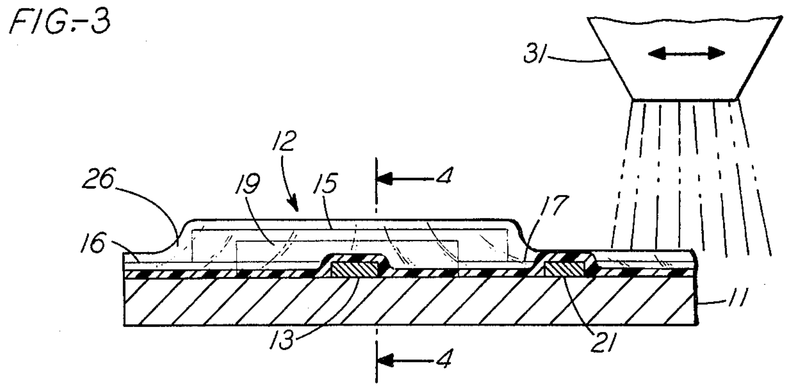
FIG. 3 is a cross-section view of the crossover circuit of FIG. 2 after the application of the hardenable substance.

In FIGS. 2 and 3, the nozzle 31 is shown in position above ths substrate 11 in proximity of the crossover circuit 12. Both FIGS. 2 and 3 are schematics and no particular scale applies to the nozzle 31, to the substrate 11 with the crossover circuit 12, or to the distance between the nozzle 31 and the substrate 11.

In applying the resin with the referred-to Zicon sprayer, the resin was sprayed without diluting solvent. The sprayed resin generated a layer 26 on the substrate 11 between 0.008 and 0.0012 of an inch. These values represent an average for the thickness of the deposited layer 26. Also, parameters of the sprayer for applying the resin are easily varied in particular cases to achieve the desired thickness in the layer 26.

The coherent layer 26 of the resin applied to the substrate 11 in the area of a crossover circuit 12 forms the described agglomeration 29 of the resin in the space 19 between the crossover conductor 15 and the substrate 11. The agglomeration 29 appears to form as a result of the physical phenomenon of capillary attraction. Capillary attraction draws the resin into the space 19 between the substrate 11 and the crossover conductor 15. As an ultimate result, the layer 26, even though it has been applied substantially uniformly over the surface 27 of the substrate 11, is of nonuniform thickness including now the agglomeration 29 and, in addition, particularly a thin area surrounding the agglomeration 29. The layer 26 has, of course, its greatest thickness in the agglomeration 29 about each crossover circuit 12. The layer 26 has, on the other hand, a minimum thickness in the area about the agglomeration 29 since the resin from this area has partially been drawn into the agglomeration 29.

As already described, applying an insufficient amount of the resin does not produce a continuous accumulation of resin under the conductor 15. On the other hand, an overly thick layer 26 of the resin requires a longer time to be etched in accordance with further steps of this invention. The application of minimum amounts of resin to the substrate 11 and visual inspection of the layer 26 to insure the formation of the single larger agglomeration 29 at each crossover circuit 12 may, therefore, be desirable. Such a visual inspection is facilitated by using a microscope employing vertical illumination of the substrate 11.

Hardening the Substance

Of course, when the resin is applied to the crossover circuit 12 in the manner described, the contact areas 21 as well as all other circuit elements on the substrate 11 become covered with the layer 26. If permitted to remain, the resin layer 26 on the contact areas 21 prevents the formation of bonds between the contact areas 21 and beam leads 23 of the chips 24 in a subsequent bonding operation. It is therefore desirable to remove the resin layer 26 from these contact areas 21 and beam leads 23 of the chip 24.

To remove the resin layer 26 from these contact areas 21 the resin is first partially cured. The curing process is initiated by permitting the substrate 11 and the applied resin layer 26 to air-dry at room temperature for approximately one-half hour. After initially air-drying the resin, the substrate 11 is placed into an oven at 150°C and cured at that temperature for approximately 2 hours. Because of the initial liquid state of the resin, and because of the particularly low viscosity the resin exhibits while initially elevated to higher temperatures, both the air-dry and oven-dry steps must be performed while the substrate 11 is maintained in a horizontal position.

After being heated for 2 hours the resin layer 26 is partially cured. Fully curing the resin at this time is not deemed advantageous even though it does not adversely affect or damage the circuits on the substrate 11. However, because of the next step of etching the resin layer 26, a partial cure is desirable, since it permits the resin to be dissolved or etched away in a much shorter period of time than the time required when the resin is fully cured.

Removing Material from the Exposed Surface of the Substance

The removal of the resin from the partially cured layer 26 requires an etchant or etch solution which attacks the cured or partially cured resin without affecting the substrate 11 or the conductors thereon. The properties of the etch solution must further permit a substantially uniform rate of removal of material from the exposed surface of the resin layer 26. Such a solution is disclosed in U.S. Pat. No. 3,673,099 to J. L. Corby et al., assigned to the Bell Laboratories.

A preferred composition of the etch solution contains 100 milliliter (ml) of tetramethylammonium hydroxide in 24% methanol. (Matheson, Coleman and Bell); 1000 grams of 1-methyl 2-pyrrolidinone (Matheson, Coleman and Bell); and 1400 ml. of isopropyl alcohol. This solution is mixed and preferably permitted to stand for 1 hour before use.

The substrate 11 is immersed into the etch solution for about 2 to 5 minutes. The exact etch time depends, of course, on the thickness of the layer 26, the strength of the etching solution and the amount of curing of the layer 26. To avoid over-etching, an initial etch time of the immersed substrate 11 is about 2 minutes.

During the time of immersion of the substrate 11 the resin layer 26 is uniformly attacked by the etch solution and the resin material is deterioriated to be washed away in a subsequent rinsing operation, or it is immediately dissolved into the solution and thereby removed from the exposed surface of the layer 26. As a result, the thickness of the coherent layer 26 decreases until the resin is completely deteriorated or eliminated from most areas of the substrate 11.

Figure 4:
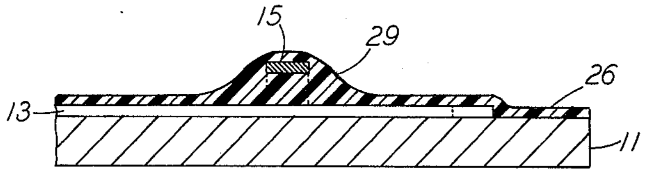
FIG. 4 is a cross-sectional view of the substrate of FIG. 3, taken along lines 4—4, showing an agglomeration of the substance about the crossover conductor.

FIGS. 3 and 4 show a portion of the substrate 11 with the applied resin layer 26 to illustrate the approximate shape of an agglomeration 29 of the resin at the crossover circuit 12. In FIG. 4 the cross-sectional view of the crossover circuit 12 characterizes the thickness of the resin layer 26 at the crossover circuit 12 in comparison with the thickness of the layer 26 over the remainder of the substrate 11.

Figure 5:
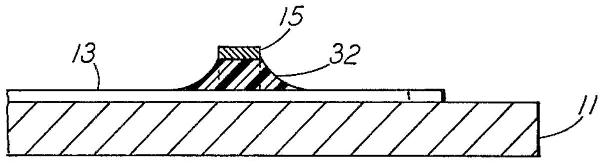
FIG. 5 is the crossover conductor of FIG. 4 after etching.

In FIGS. 4 and 5, the effect of uniform removal of the resin material from the exposed surface of the resin layer 26 is best shown. The cross-sectional view in FIG. 4 shows the layer 26 and the agglomeration 29 of resin about the crossover circuit 12 before etching (either before or after curing of the resin). After etching, only the resin in the agglomeration 29 about the crossovers remains in undeteriorated form on the substrate 11. The agglomerations 29 form a finished support 32 between the conductor 15 and substrate 11.

The support 32 remains after etching and rinsing because of the substantially uniform removal of the hardened layer 26 from the substrate 11. However, the presence of the crossover conductor 15 may also contribute to some extent in shielding the portion of the hardened layer 26 under the crossover conductor 15 from the etching solution.

FIG. 5 shows a cross-section through the support 32 after etching has continued for approximately 2 minutes 15 seconds and all attacked and deteriorated resin material has been removed. The underlying conductor 13 and connecting contact area 21 (not shown in FIG. 5) are cleaned of resin to permit bonding of the chip 24 to the substrate 11.

Further etching deteriorates or removes more resin from the agglomeration 29 to undercut and weaken the formed support 32. Inspection of the etched product and minor adjustments in the etching time may be required.

After having been subjected to the etching solution, the substrate 11 is removed from the etching solution and rinsed in tap water followed by a rinsing in deionized water, if desired. Rinsing the substrate 11 removes resin which has been attacked by the etching solution but has not yet been removed. Preferably, a flow of rinsing water is directed across the surface of the substrate 11 to carry away loose particles of deteriorated resin and to guard against a redeposition of such particles on the substrate 11. The substrate 11 is then taken from the rinsing bath and dried in a stream of dry air directed against its surface.

After having been dried, the substrate 11 should be inspected for stains. Stains indicate a residue of resin which may interfere with a subsequent bonding operation. Consequently, if stains are present the substrate is re-etched for approximately two seconds, then rinsed for two minutes and then dried.

Final Cure

The support 32 may now be subjected to a final cure treatment to thoroughly harden the resin of the support 32. The time interval for curing the resin depends, of course, as it is well known, on the temperature of the resin. To complete the cure in a relatively short time as, for instance, 4–16 hours, temperatures of 300° to 250°C, respectively, are necessary.

Even though this invention has been described in terms of a specific embodiment, it should be realized that changes and alterations are possible without departing from the scope and the spirit of this invention. The invention is limited only by the scope of the appended claims.

What is claimed is:

1. A method of forming an insulative support between a circuit substrate and a conductive member spaced from the substrate, which comprises:

applying a hardenable, wetting, liquid substance, which is an electric insulator when hardened or at least partially cured, to the substrate to form a layer of sufficient thickness to permit capillary attraction to draw the substance into, and fill the space between, the member and the substrate;

hardening the layer to form the insulative support between the substrate and the member; and removing a top portion of the surface of the hardened layer substantially uniformly until the layer is eliminated everywhere from the substrate except for those portions of the layer that form the support between the member and the substrate.

2. A method according to claim 1, wherein:

the substance applied to the substrate is a methyl phenyl polysiloxane resin;

hardening the layer formed from the substance comprises partially curing the resin; and removing a portion of the surface of the layer comprises etching the resin layer in an etchant consisting substantially of tetramethylammonium hydroxide dissolved in methanol, 1-methyl 2-pyrrolidinone, and isopropyl alcohol, rinsing the substrate in water after the etching, and then drying the substrate.

3. A method according to claim 2, comprising: further curing the resin after drying the substrate.

4. A method according to claim 3, wherein the resin is applied to a substrate having electrical conductors on its surface, wherein the member is a crossover conductor vertically spaced from an underlying conductor by about 0.001 to about 0.005 inch and wherein the resin is applied to form a layer which has a thickness of about 0.001 inch.

5. A method of applying a supporting and insulating substance about and under conductive members mounted to and at least partially spaced from the surface of a circuit substrate, which comprises:

applying ths substance substantially uniformly over at least a portion of the surface of the substrate that includes the conductive members;

flowing the substance as a wetting liquid to agglomerate the applied substance by capillary attraction about and under the conductive members to form a layer having an increased thickness in the areas of the conductive members;

hardening the applied substance; and then removing a top portion of substantially uniform thickness of the layer of the applied substance to eliminate it from the surface of the workpiece other than under the conductive members and in the areas of increased thickness adjacent the conductive members.

* * * * *

UNITED STATES PATENT OFFICE
CERTIFICATE OF CORRECTION

Patent No. 3,915,769 Dated October 28, 1975

Inventor(s) Robert L. Moore

It is certified that error appears in the above-identified patent and that said Letters Patent are hereby corrected as shown below:

Column 1, line 22, "dielectricinsulated" should be --dielectric-insulated--.

Column 5, line 35, "0.008" should be --0.0008--.

Signed and Sealed this

*ninth* Day of *March 1976*

[SEAL]

*Attest:*

RUTH C. MASON
*Attesting Officer*

C. MARSHALL DANN
*Commissioner of Patents and Trademarks*